(12) United States Patent
Usenko (10) Patent No.: US 10,840,080 B2
(45) Date of Patent: Nov. 17, 2020

(54) METHODS OF FORMING SOI SUBSTRATES

(71) Applicant: Taiwan Semiconductor Manufacturing Co., Ltd., Hsinchu (TW)

(72) Inventor: Alex Usenko, Lake St Louis, MO (US)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 15/861,629

(22) Filed: Jan. 3, 2018

(65) Prior Publication Data

US 2019/0088466 A1 Mar. 21, 2019

Related U.S. Application Data

(60) Provisional application No. 62/561,159, filed on Sep. 20, 2017.

(51) Int. Cl.
| | |
|---|---|
| *H01L 21/40* | (2006.01) |
| *H01L 21/02* | (2006.01) |
| *H01L 21/20* | (2006.01) |
| *H01L 21/762* | (2006.01) |
| *H01L 21/306* | (2006.01) |

(52) U.S. Cl.
CPC ...... *H01L 21/02019* (2013.01); *H01L 21/024* (2013.01); *H01L 21/02112* (2013.01); *H01L 21/02318* (2013.01); *H01L 21/02376* (2013.01); *H01L 21/02381* (2013.01);
(Continued)

(58) Field of Classification Search
CPC .......... H01L 21/76254; H01L 21/185; H01L 21/762; H01L 29/02; H01L 21/2007; H01L 21/0206; H01L 21/022; H01L 21/02238; H01L 21/02326; H01L 21/02667; H01L 21/02019; H01L 21/0203; H01L 21/02112; H01L 21/02258; H01L 21/02318; H01L 21/02376; H01L 21/02381; H01L 21/02387; H01L 21/024; H01L 21/02521; H01L 21/02532; H01L 21/02592; H01L 21/0262; H01L 21/30604; H01L 21/3065; H01L 21/76251; H01L 21/7627; H01L 21/76286; H01L 27/1203; H01L 31/182;
(Continued)

(56) References Cited

U.S. PATENT DOCUMENTS

| | | | |
|---|---|---|---|
| 5,013,681 A | * | 5/1991 | Godbey ............... G03F 1/22 257/E21.219 |
| 5,310,451 A | | 5/1994 | Tejwani et al. |

(Continued)

OTHER PUBLICATIONS

D. Godbeyt et al., "A Si0.7Ge0.3 strained-layer etch stop for the generation of thin layer undoped silicon", Applied. Physics. Letters. vol. 56, No. 4, Jan. 22, 1990,pp. 373-375.

(Continued)

*Primary Examiner* — Robert G Bachner
(74) *Attorney, Agent, or Firm* — JCIPRNET (57) ABSTRACT

Methods of forming SOI substrates are disclosed. In some embodiments, an epitaxial layer and an oxide layer are formed on a sacrificial substrate. An etch stop layer is formed in the epitaxial layer. The sacrificial substrate is bonded to a handle substrate at the oxide layer. The sacrificial substrate is removed. The epitaxial layer is partially removed until the etch stop layer is exposed.

17 Claims, 9 Drawing Sheets

(52) U.S. Cl.
CPC .... *H01L 21/02387* (2013.01); *H01L 21/2007* (2013.01); *H01L 21/76256* (2013.01); *H01L 21/30608* (2013.01)

(58) Field of Classification Search
CPC ..... C30B 11/002; C30B 29/06; Y02E 10/546; Y02P 70/521
See application file for complete search history.

(56) References Cited

U.S. PATENT DOCUMENTS

| | | | |
|---|---|---|---|
| 7,348,259 | B2 | 3/2008 | Cheng et al. |
| 2005/0136624 | A1* | 6/2005 | Cheng ............... H01L 21/30608 438/478 |
| 2007/0005446 | A1 | 3/2007 | Enicks |
| 2010/0216295 | A1* | 8/2010 | Usenko ............. H01L 21/76254 438/470 |
| 2014/0284769 | A1* | 9/2014 | Halimaoui ........ H01L 21/02694 257/616 |

OTHER PUBLICATIONS

D. Godbeyt et al., "Fabrication of Bond and Etch-Back Silicon on Insulator Using a Strained Si0.7TGe0.3 Layer as an Etch Stop", J. Electrochem. Sac., vol. 137, No. 10, Oct. 1990, pp. 3219-3223.

E. E. King et al.,"CMOS on Bonded Wafers Fabricated Using a Novel Si—Ge Etch Stop", 1991 IEEE International SOI Conference Proceedings, Oct. 1-3, 1991, pp. 112-113.

SS.Iyer et al.,"High-performance CMOS fabricated on ultrathin BESOI with sub-10 nm ttv", Proceedings of 1993 IEEE International SOI Conference, Oct. 5-7, 1993, pp. 134-135.

S. L. Suder et al.,"Deposition and characterization of strained SiGe layer as an etch stop in ultrathin SOI integration", 210th ECS Meeting, Abstract #1406, 2006.

I. L. Berry et al.,"High resolution patterning of silicon by selective gallium doping",J. Vac. Sci. Technol. B, vol. 1 No. 4, 1983, pp. 1059-1061.

A. J. Steckl et al.,"Localized fabrication of Si nanostructures by focused ion beam implantation", Appl. Phys. Lett. vol. 60, No. 15, Apr. 13, 1992, pp. 1833.

Päivi Sievilä et al.,"The fabrication of silicon nanostructures by focused-ion-beam implantation and TMAH wet etching", Nanotechnology, vol. 21,145301, Mar. 10, 2010, pp. 1-7.

D. Feijoo et al., "Etch Stop Barriers in Silicon Produced by Ion Implantation of Electrically Non-Active Species", J. Electrochem. Soc., vol. 139, No. 8, Aug. 1992, pp. 2309-2314.

* cited by examiner

METHODS OF FORMING SOI SUBSTRATES

CROSS-REFERENCE TO RELATED APPLICATION

This application claims the priority benefits of U.S. provisional application Ser. No. 62/561,159, filed on Sep. 20, 2017. The entirety of the above-mentioned patent application is hereby incorporated by reference herein and made a part of this specification.

BACKGROUND

Conventional silicon-on-insulator (SOI) CMOS devices typically have a thin layer of silicon, also known as the active layer, on an insulator layer such as a buried oxide (BOX) layer. Active devices, such as MOS transistors (MOSFETs), are formed in active regions within the active layer. Active devices in the active regions are isolated from the substrate by the BOX layer.

Devices formed on SOI substrates exhibit many improved performance characteristics over their bulk substrate counterparts. SOI substrates are particularly useful in reducing problems relating to reverse body effects, device latch-up, soft-error rates, and junction capacitance. SOI technology therefore enables higher speed performance, higher packing density, and reduced power consumption. However, the conventional technique for the fabrication of a SOI substrate is usually expensive and unable to provide a uniform thickness of the silicon layer of the SOI substrate.

DETAILED DESCRIPTION

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
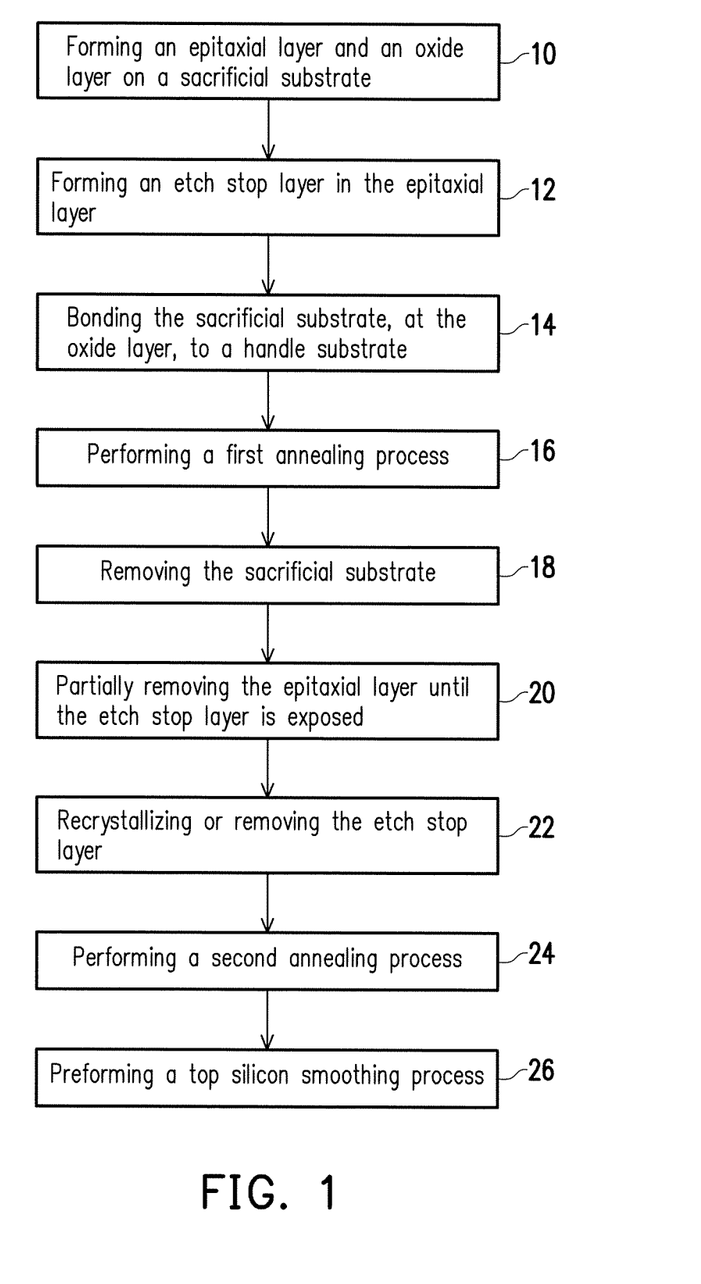
FIG. 1 is a flow chart of a method of forming a SOI substrate in accordance with some embodiments.

FIG. 1 is a flow chart of a method of forming a SOI substrate in accordance with some embodiments. FIG. 2A to FIG. 2K are cross-sectional views of a method of forming a SOI substrate in accordance with some embodiments.

Figure 2A:
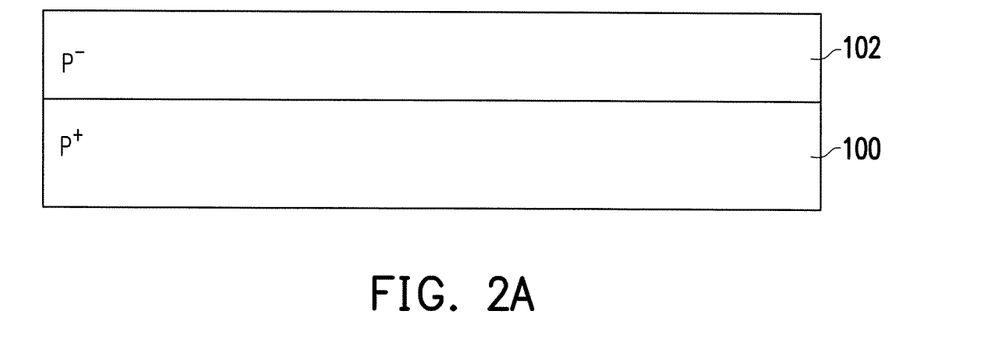
FIG. 2A to FIG. 2K are cross-sectional views of a method of forming a SOI substrate in accordance with some embodiments.
Figure 2B:
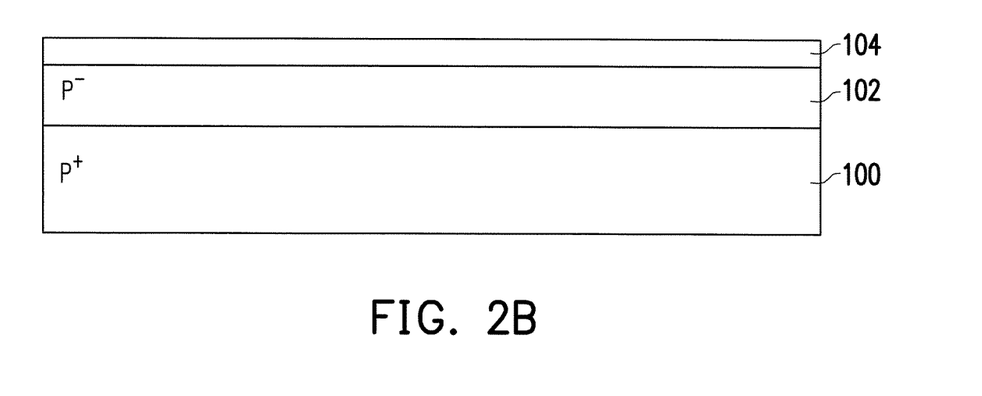

Referring to FIG. 1 and FIG. 2A to FIG. 2B, in operation 10, an epitaxial layer 102 and an oxide layer 104 are formed on a sacrificial substrate 100.

In some embodiments, the sacrificial substrate 100 includes silicon. For example, the sacrificial substrate 100 includes single-crystalline silicon. In some embodiments, the sacrificial substrate 100 is heavily doped with a first conductivity type. For instance, the sacrificial substrate 100 is chosen to be a $P^+$ silicon wafer.

In some embodiments, the sacrificial substrate 100 is subsequently subjected to operations of epitaxy, oxidation and ion implantation, and is completely removed during further thinning operation. Therefore, it can be a very cheap wafer with lower grade as test or even a mechanical wafer. In some embodiments, the sacrificial substrate 100 has a defect-free top surface to enable the high quality epitaxial growth on it and has a low-warpage property to sustain the subsequent bonding operation.

In some embodiments, the $P^+$ sacrificial substrate 100 has a very wide range of doping type and level—at least from about 1E18 $cm^{-3}$ to 1E20 $cm^{-3}$. The lower end of doping which is equal to about 0.1 Ohm-cm in wafer resistivity is chosen for keeping high etch rate in HNA wet etchant (will be described in details in operation 18). The higher end of the range (which is equal to about $10^{-3}$ Ohm-cm resistivity) is determined in accordance with ability to grow a defect-free epitaxial layer on it.

Thereafter, the epitaxial layer 102 is epitaxially grown on the sacrificial substrate 100. The epitaxial conditions such as temperature, feed gases, etc. are chosen to provide high quality (e.g., defect-free) epitaxial film and high throughput. In some embodiments, the epitaxial layer 102 includes silicon. In some embodiments, the epitaxial layer 102 includes single-crystalline silicon. In alternative embodiments, the epitaxial layer 102 includes polycrystalline silicon. The properties of the epitaxial layer 102 are chosen to be equal to the desired electrical properties of final superficial film on the SOI wafer. In some embodiments, the epitaxial layer 102 is referred to as a device layer through the specification. In some embodiments, the epitaxial layer 102 is lightly doped with the first conductivity type. For example, the epitaxial layer 102 is chosen to be a $P^-$ silicon layer. In some embodiments, the sacrificial substrate 100 and the epitaxial layer 102 are of the same conductivity type, and the sacrificial substrate 100 has a doping concentration greater than that of the epitaxial layer 102. In some embodiments, the thickness of the epitaxial layer 102 is chosen in a range from one to few microns.

In some embodiments, as shown in FIG. 2B, the epitaxial layer 102 is oxidized to form an oxide layer 104 on a top of the remaining epitaxial layer 102. Specifically, the oxide layer 104 is formed by oxidizing a top portion of the epitaxial layer 102. The oxidation conditions are chosen to form high quality (e.g., defect-free) oxide and high quality interface between the oxide layer 104 and the epitaxial layer 102. In some embodiments, the epitaxial layer 102 is thermally oxidized to a thickness equal to a desired buried oxide (BOX) thickness, such as between about 20 and 200 nm. In alternative embodiments, the BOX thickness in excess of 200 nm is desired. In some embodiments, thermal oxidation such as dry oxidation is still performed to 200 nm, and the rest of the BOX thickness comes from oxide grown on another substrate such as a handle substrate. In some embodiments, the oxide thickness on the device layer (e.g., the epitaxial layer 102) is limited because later in the process flow, an ion implantation is to be performed through oxide; the thicker oxide the higher energy of ions is required.

In alternative embodiments, the oxide layer 104 is formed by depositing an oxide material on the epitaxial layer 102 without consuming the thickness of the epitaxial layer 102. For example, the oxide layer 104 is deposited by chemical vapor deposition (CVD), physical vapor deposition (PVD), atomic layer deposition (ALD) or a suitable method.

Figure 2C:
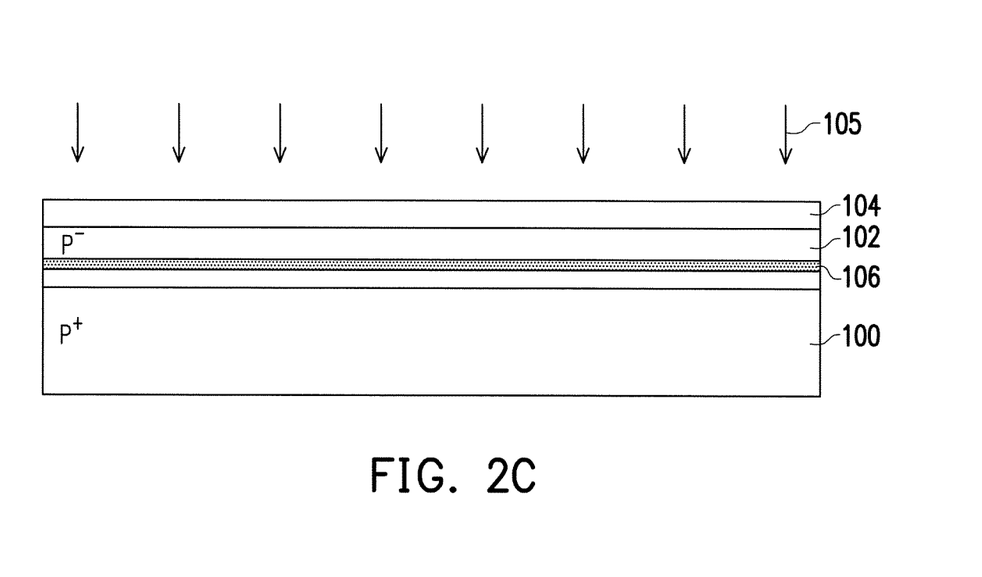

Referring to FIG. 1 and FIG. 2C, in operation 12, an etch stop layer 106 is formed in the epitaxial layer 102.

In some embodiments, the method of forming the etch stop layer 106 in the epitaxial layer 102 includes performing an ion implantation process 105 through the oxide layer 104. In some embodiments, the ion implantation process 105 partially amorphizes the epitaxial layer 102. For example, the ion implantation process 105 amorphizes a middle portion of the epitaxial layer 102, so as to form the etch stop layer 106.

In some embodiments, the etch stop layer 106 is formed in a fully amorphous state. In alternative embodiments, the etch stop layer 106 is formed in a partially amorphous state; that is, the etch stop layer 106 is formed in a mixed crystalline-amorphous state and having some degree of structural order. In some embodiments, the etch stop layer 106 is referred to as an amorphous or amorphized layer through the specification.

Factors for choosing the implant element ions or ion species include: no doping activity for silicon, ability to amorphize silicon, implanter compatibility, penetration depth (Rp), etc. The non-doping factor limits the choice of the species to group IV elements (e.g., C, Si, Ge, Sn), noble gas elements (e.g., He, Ne, Ar, Kr, Xe), halogen elements (e.g., F, Cl, Br, I) and inorganic gas elements (e.g., N, O).

In some embodiments, the amorphizing factor removes light ions (such as He) from this list, as light ions do not amorphize the silicon. For example, the element for the ion implantation process 105 includes C, Si, Ge, Ne, Ar, Kr, Xe, F, Cl, Br, I, N, O or a combination thereof.

Specifically, hydrogen or helium implant are not adopted because light ions cannot cause amorphization of silicon, and hydrogen or helium forms gaseous bubbles inside of silicon upon annealing. These bubbles are not removable anymore upon annealing, so the top of silicon film contains empty voids left after the hydrogen or helium diffuses away. Also, some implanted hydrogen or helium diffuses to sinks in the structure. A sink in SOI is the interface between top silicon and BOX. Eventually, bubbles and voids are formed on that interface, and the chip performance on such SOI wafer is lowered. Current disclosure allows no-bubble implants (such as Si-into-Si) and therefore provides better quality of the SOI wafer.

In some embodiments, the implanter compatibility precludes halogens as these erode the chamber. For example, the element for the ion implantation process 105 includes C, Si, Ge, Ne, Ar, Kr, Xe, N, O or a combination thereof.

In some embodiments, Rp factor removes heavy ions (such as Sn, I, Xe) from the list. For example, the element for the ion implantation process 105 is selected from the group consisting of C, Si, Ge, Ne, Ar, Kr, N and O.

The implantation energy is appropriately chosen to create a buried amorphous layer (e.g., etch stop layer 106) inside of the epitaxial layer 102. In some embodiments, the implantation energy ranges from about 60 to 600 keV. The amorphous layer is formed as ions displace the silicon atoms from the lattice sites. Ions entering the solid target first lose their energy on interactions with electrons, so only ionization happen. When the implantation energy drops below about 20 keV, interaction with atoms becomes the main energy loss mechanism. Therefore, near the end of their range, ions displace the silicon atoms, cascades of displacements give local amorphized regions, and when overlapping amorphized regions form a continuous layer, the amorphizing process completes. The amorphization threshold dose for every combination of element ions can be adjusted as needed. For example, for silicon-into-silicon room temperature implantation at 200 keV, the amorphization threshold dose is about $5E14$ $cm^{-2}$. The implantation dose is chosen to slightly exceed the amorphization threshold dose. Excess of the dose is undesirable. If the dose is too high, residual damages negatively affect the final chip performance. For example, the implantation doses of species are chosen to exceed the amorphization threshold but not exceed double dose of said threshold.

The implantation energy is chosen to create a buried amorphous layer at desired depth. The desired depth here is a sum of oxide thickness and thickness of the future superficial silicon film. For example, if a SOI wafer has 200 nm BOX and 80 nm top silicon, the buried amorphous layer is at 280 nm. Thickness of the amorphized layer depends on species, energy and dose. For example, the silicon-into-silicon implant into wafer with 200 nm oxide over epitaxy at 210 keV and $6E14$ $cm^{-2}$ has Rp at 280 nm, and form a buried amorphous layer propagating from about 280 to 340 nm in depth.

In some embodiments, the etch stop layer 106 is a blanket amorphous silicon layer. In alternative embodiments, the etch stop layer 106 is a "patterned" amorphous silicon layer, and therefore open new opportunities in making patterned SOI wafer—wafer with different silicon thicknesses. This gives new options for chip designers.

Figure 2D:
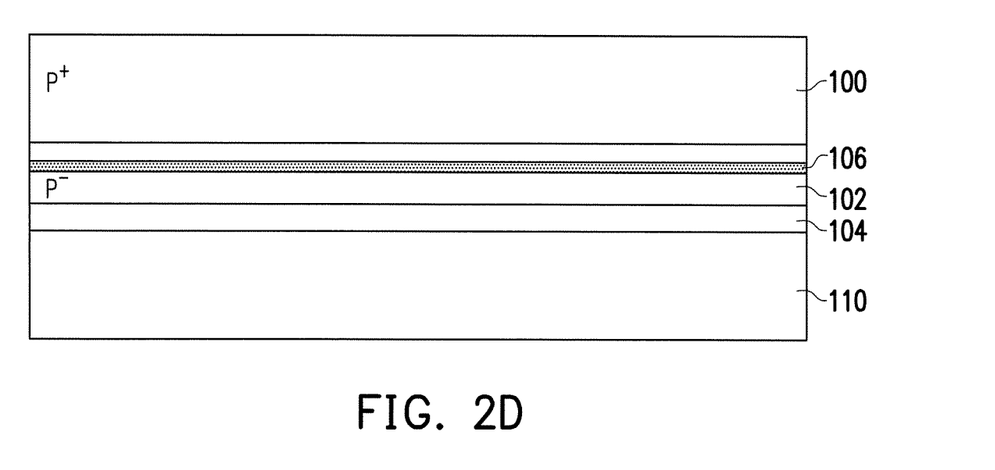

Referring to FIG. 1 and FIG. 2D, in operation 14, the sacrificial substrate 100 is bonded to a handle substrate 110 at the oxide layer 104.

In some embodiments, the sacrificial substrate 100 with the epitaxial layer 102, the oxide layer 104 and the etch stop layer 106 is flipped and bonded to the handle substrate 110. Depending on future application, the handle wafer might be just a cheap mechanical support with bondability (e.g., low surface roughness and low warp). If thick BOX is needed, the sacrificial substrate 100 can have an oxide, so together with oxide on the handle substrate 110, the desired total BOX thickness can be achieved.

In some embodiments, the handle substrate 110 includes silicon. In some embodiments, the handle substrate 110 includes single-crystalline silicon. In alternative embodiments, the handle substrate 110 includes polycrystalline silicon. For advanced RF applications, the handle wafer 110 includes a high resistivity polysilicon film over a high resistivity single-crystalline silicon film, and the sacrificial substrate 100 is bonded to the high resistivity polysilicon film of the handle substrate 110 at the oxide layer 104.

In some embodiments, before the bonding process, the substrates or wafers are cleaned from particles, organics, and metal contamination in a standard wet chemical RCA clean bath sequence, and then dried with Marangoni or a suitable process. In some embodiments, one or both substrates are processed in plasma to additionally activate the surfaces and thus improve bonding yield. Stay-alone plasma tools or plasma modules integrated in a bonding tool can be used.

Figure 2E:
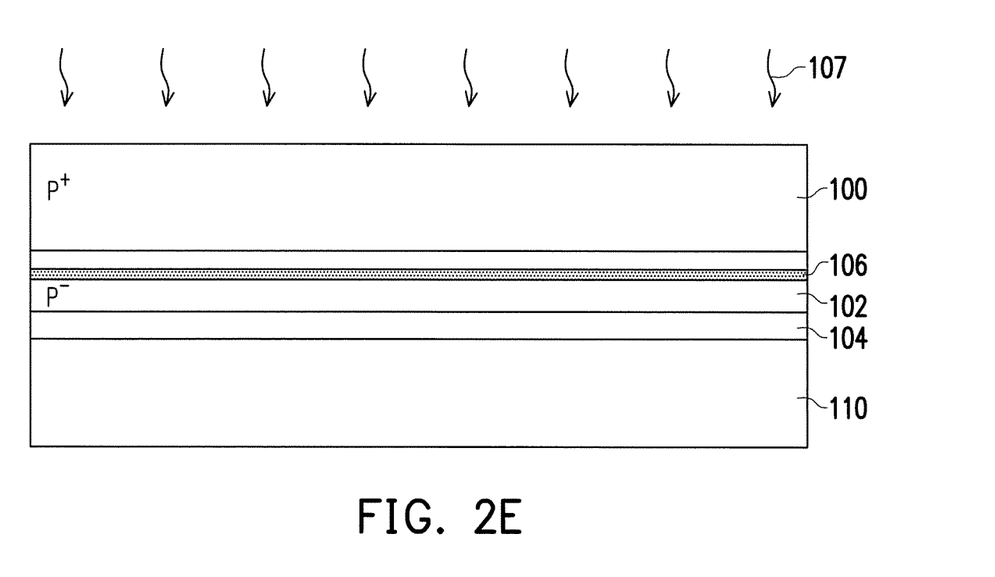

Referring to FIG. 1 and FIG. 2E, in operation 16, a first annealing process 107 is performed after bonding the sacrificial substrate 100 to the handle substrate 110.

In some embodiments, the substrates or wafers are mated in a bonding chamber and an assembly of two substrates is thermally processed to strengthen the bond to a level the assembly can survive the following mechanical grinding process. In some embodiments, the first annealing process 107 is referred to as a first post-bonding or post-mating annealing through the specification. In some embodiments, the first annealing process 107 is performed still at low enough temperature to preserve the etch stop layer 106 (i.e., buried amorphous film), so it is in a range from about 100° C. to 400° C. This annealing can be optimized to achieve additional advantages. For example, 400° C. anneal already evolves the buried amorphous layer significantly—it shrinks in thickness (good), edges become more sharp (good), "roughness" of the crystalline-amorphous border lowers (good), but compressive stress level might drop (bad). In some embodiments, the higher stress, the higher wet etch selectivity, therefore the excessive anneal at this operation is undesirable.

Figure 2F:
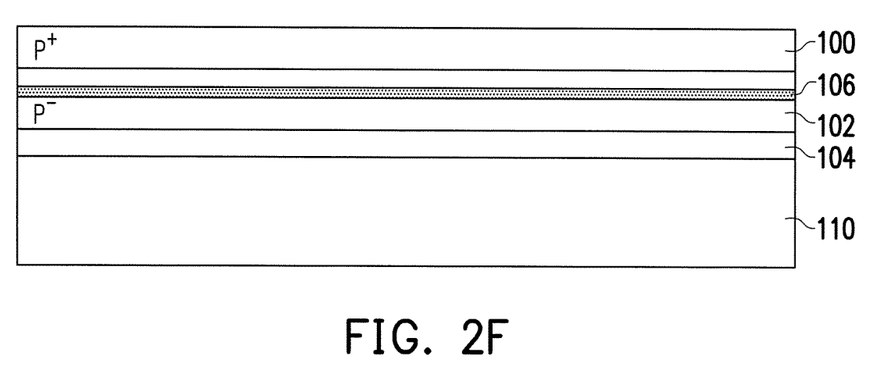
Figure 2G:
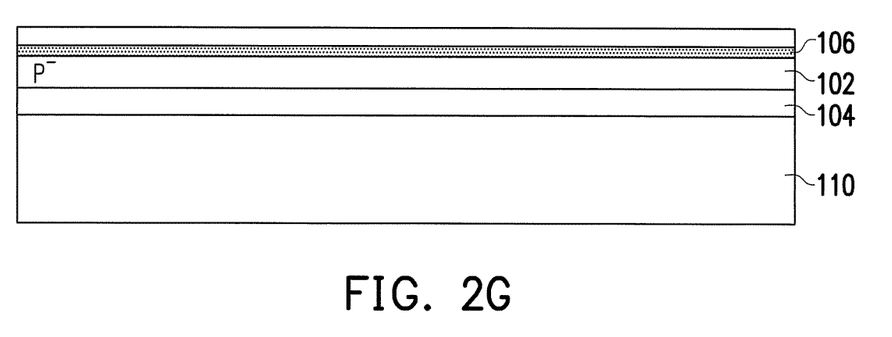

Referring to FIG. 1 and FIG. 2F to FIG. 2G, in operation 18, the sacrificial substrate 100 is removed.

In some embodiments, the major part of the sacrificial substrate 100 is grinded away, as shown in FIG. 2F. After the grinding, the subsurface regions have cracks propagating up to about 10 micron deep. Therefore, enough material has to remain, so no crack reaches the epitaxial layer 102. On the other side, minimum allowable silicon remaining after the grinding allows shorter etch time the next operation of wet etching, thus saving total process cost. In some embodiment, the reminder of the P+ sacrificial substrate 100 is removed by selective wet etch, as shown in FIG. 2G. For example, HNA (hydrofluoric-nitric-acetic acids mixture) bath can be used. Ratio of acids, bath temperature, etc. can be adjusted as needed, so as to achieve high throughput, high selectivity, and minimum residual roughness of the now revealed epitaxial layer 102.

Figure 2H:
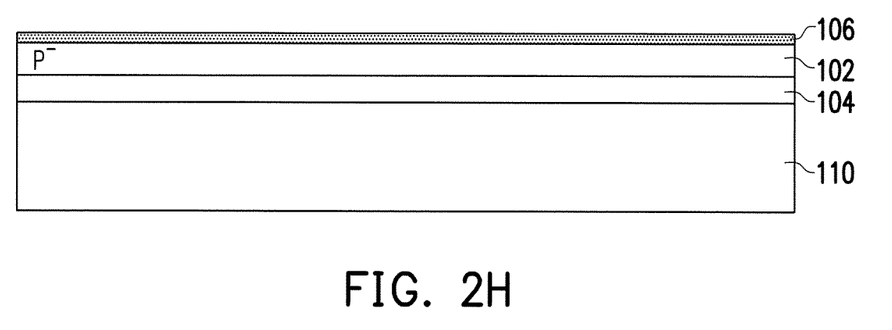
Figure 2I:
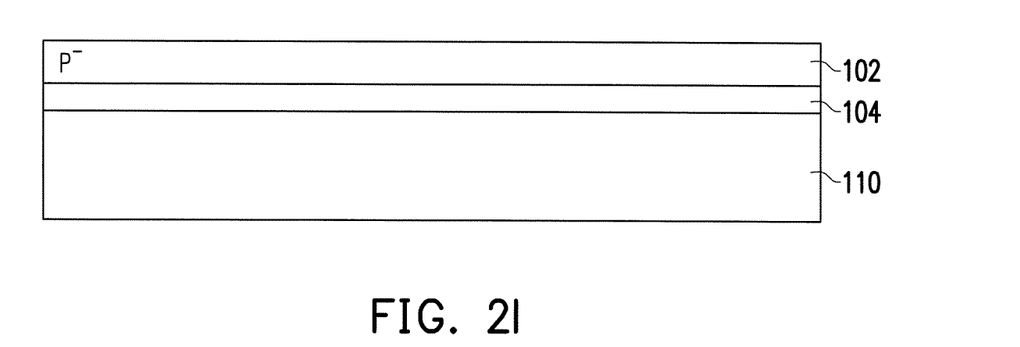

Referring to FIG. 1 and FIG. 2H, in operation 20, the epitaxial layer 102 is partially removed until the etch stop layer 106 is exposed.

In some embodiments, the P− epitaxial layer 102 is etched away until the surface of the etch stop layer 106 is exposed. For example, selective etchants having high etching rate of low doped silicon—i.e., alkaline etchants as KOH, TMAH or EDP can be used. For example, 25% TMAH solution in water at 85° C. can be used.

Referring to FIG. 1 and FIG. 2G, in operation 22, the etch stop layer 106 is recrystallized or removed.

In some embodiments, the etch stop layer 106 of the epitaxial layer 102 is recrystallized, so the etch stop layer 106 of amorphous silicon can be converted back into regular silicon, such as single-crystalline silicon or polycrystalline silicon. In some embodiments, to "erase" this etch stop layer 106, the substrate is heated over the thermal stability temperature of amorphous silicon (i.e., 600C). In some embodiments, a recrystallization annealing is performed with a slow temperature ramp up (e.g., under about 10° C./minute), so no crystal nucleation centers originate inside of the amorphous film, and solid state epitaxy proceeds. In some embodiments, a recrystallization annealing is performed until all implant induced defects are healed and the former etch stop layer becomes part of the final top silicon layer.

In some embodiments, a thinning and smoothing operation is optionally performed, so as to remove higher defect level silicon obtained by solid state epitaxy and leave only initial epitaxial layer 102. Specifically, the P− epitaxial layer 102 as a device layer is subjected to a final thinning to achieve the desired final thickness of the top silicon film. In some embodiments, an annealing in HCl gas at a temperature range from about 1000° C. to 1200° C. can be used. In alternative embodiments, oxidation/oxide strip cycle can be used.

In alternative embodiments, instead of the erasing/recrystallization operation and the thinning and smoothing operation described above, the etch stop layer 106 of amorphous silicon is etched away until the surface of the epitaxial layer 102 is exposed. In some embodiments, the amorphized etch stop layer 106 can be selectively etched by (1) hydrogen plasma, (2) XeF$_2$ gas, (3) HCl gas at elevated temperature, (4) in acidic wet etchant as HNA, (5) by oxidation/oxide strip cycle, or (6) plasma etch in SF$_6$ and/or SiF$_4$. Among the listed methods, etching in HCl gas and oxidation/strip show the highest built-in smoothing capability. Final roughness achievable with these methods is in order of about 2 Å rms. Thus, another cost saving option is—eliminating the final smoothing operation. In some embodiments, if the specification for roughness is stricter—below about 1 Å rms, an argon or hydrogen annealing can be used.

Figure 2J:
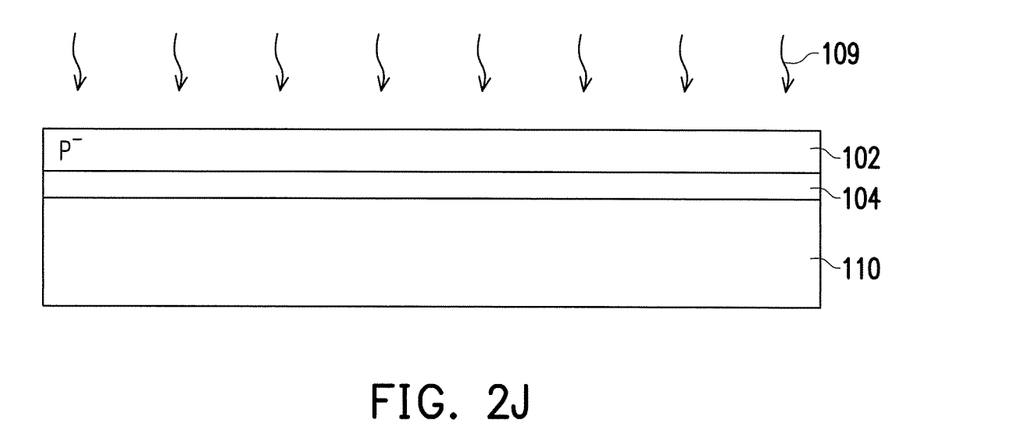

Referring to FIG. 1 and FIG. 2J, in operation 24, a second annealing process 109 is performed after recrystallizing or removing the etch stop layer 106.

In some embodiments, to further improve quality of the bonding interface, an annealing is performed at a temperature of about 1100-1200° C. In some embodiments, the second annealing process 109 is referred to as a second post-bonding or post-mating annealing through the specification. The second annealing process 109 allows enough diffusion so the SiO$_2$ on the interface becomes stoichiometric. In some embodiments, the temperature of the first annealing process 107 is less than the temperature of second annealing process 109.

Figure 2K:
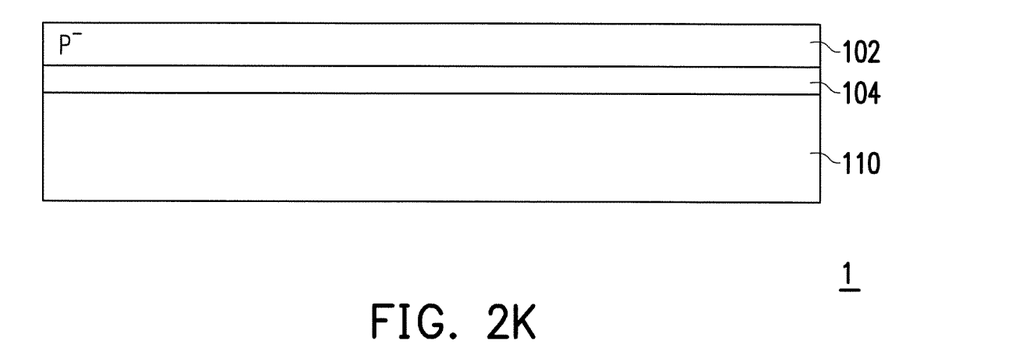

Referring to FIG. 1 and FIG. 2K, in operation 26, a top silicon smoothing process is optionally performed.

In some embodiments, the surface of silicon film is smoothed to near atomic flatness, such as about 2 Å rms or even less. This top silicon smoothing operation can be performed using processes described above, such as HCl annealing or oxidation/oxide strip cycle. A Bond-and-Etchback Silicon-on-Insulator (BESOI) substrate or a SOI substrate 1 of the disclosure is thus completed. In some embodiments, the SOI process includes operations that are not described here to keep clarity, such as wafer edge trimming, edge of top silicon film defining, numerical cleaning and metrology operations between process operations.

The above embodiments are directed to final wafer quality. The following embodiments are designed toward wafer quality and cost saving.

Figure 3:
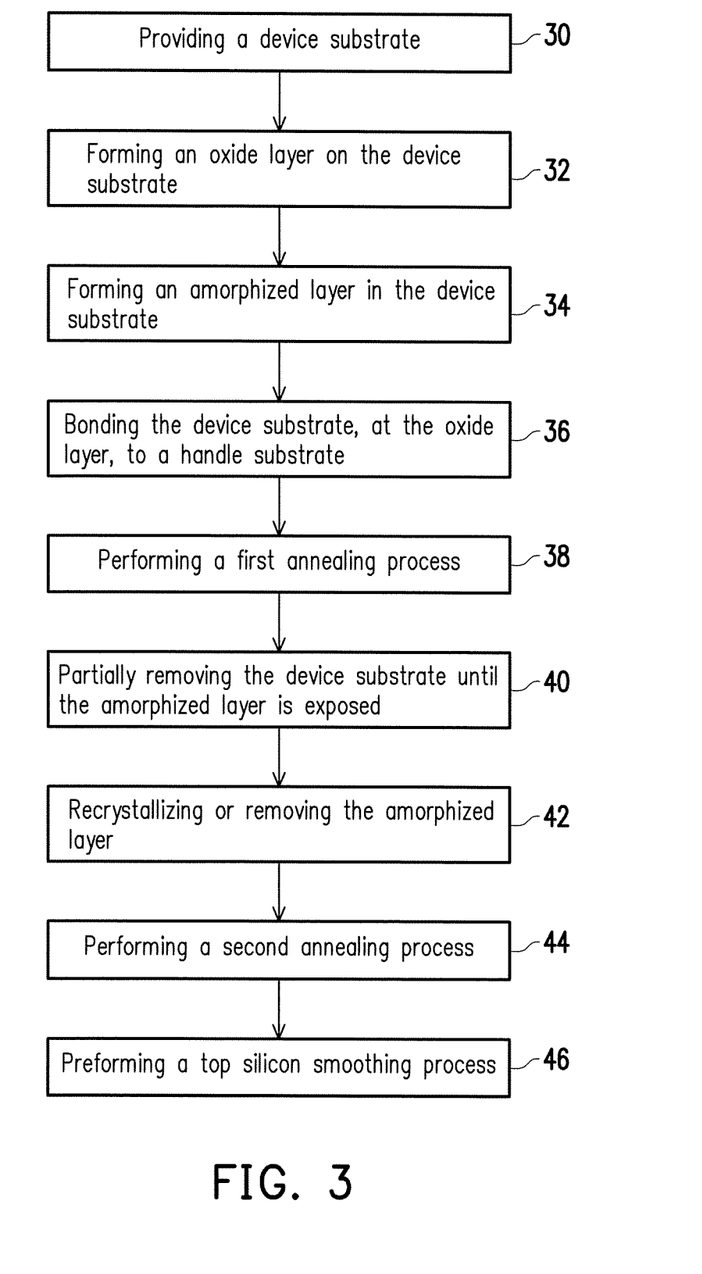
FIG. 3 is a flow chart of a method of forming a SOI substrate in accordance with alternative embodiments.

FIG. 3 is a flow chart of a method of forming a SOI substrate in accordance with alternative embodiments. FIG. 4A to FIG. 4I are cross-sectional views of a method of forming a SOI substrate in accordance with alternative embodiments.

Figures 4A, 4B:
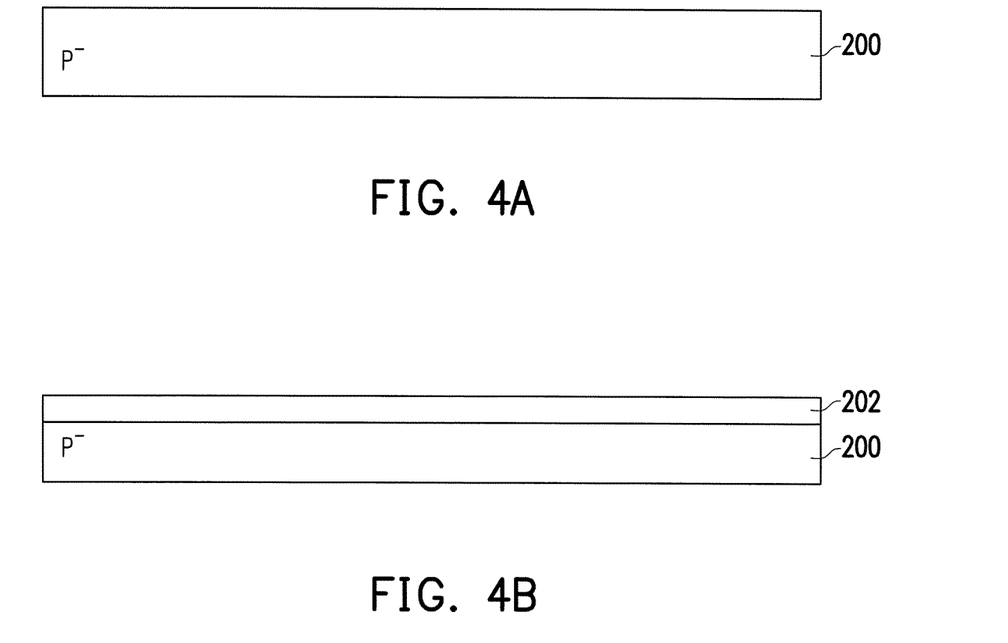
FIG. 4A to FIG. 4I are cross-sectional views of a method of forming a SOI substrate in accordance with alternative embodiments.

Referring to FIG. 3 and FIG. 4A, in operation 30, a device substrate 200 is provided.

In some embodiments, the device substrate 200 includes silicon. For example, the device substrate 200 includes single-crystalline silicon. In alternative embodiments, the device substrate 200 includes polycrystalline silicon. The device substrate 200 is a lightly doped wafer with resistivity equal to desired in the final device film of the SOI substrate. In some embodiments, the device substrate 200 is lightly doped with a first conductivity type. For instance, the device substrate 200 is chosen to be a P− silicon wafer.

In some embodiments, the device substrate 200 has a denuded zone so the final device film is free of oxidation induced stacking faults, SOPs (crystal originated particles), etc. Epitaxial operations can be omitted. The epitaxial elimination is the major cost saving. Also, the non-EPI process gives full control of the final device silicon film thickness to ion implantation process, so eventually superior film thickness uniformity can be achieved.

Referring to FIG. 3 and FIG. 4B, in operation 32, an oxide layer 202 is formed on the device substrate 200.

The operation 32 is similar to the oxide forming in operation 10 described above. In some embodiments, the oxide layer 202 is formed by oxidizing a top portion of the device substrate 200. In alternative embodiments, the oxide layer 202 is formed by depositing an oxide material on the device substrate.

Figure 4C:
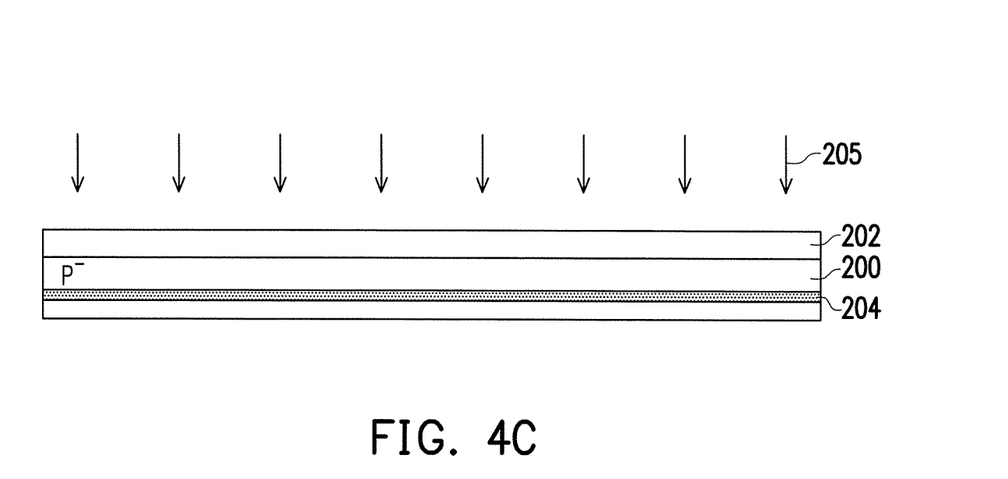

Referring to FIG. 3 and FIG. 4C, in operation 34, an amorphized layer 204 is formed in the device substrate 200.

The operation 34 is similar to the operation 12 described above. In some embodiments, the method of forming the amorphized layer 204 includes performing an ion implantation process 205 through the oxide layer 202. In some embodiments, the ion implantation process 205 amorphizes a middle portion of the device substrate 200, so as to form the amorphized layer 204. In some embodiments, the element for the ion implantation process 205 includes C, Si, Ge, Ne, Ar, Kr, Xe, F, Cl, Br, I, N, O or a combination thereof.

Figure 4D:
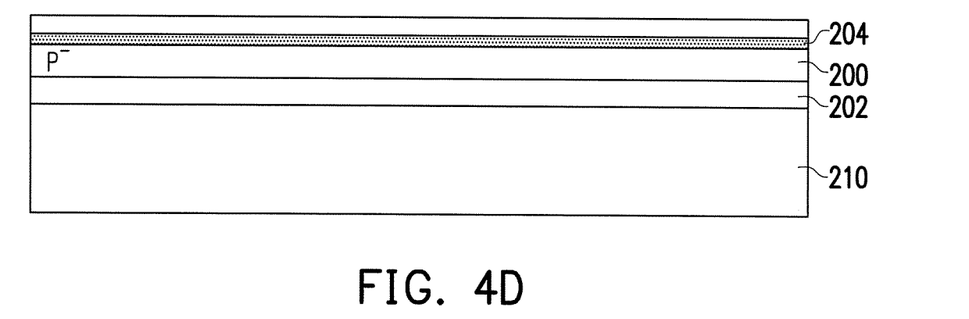

Referring to FIG. 3 and FIG. 4D, in operation 36, the device substrate 200 is bonded to a handle substrate 210 at the oxide layer 202.

The operation 36 is similar to the operation 14 described above. In some embodiments, the device substrate 200 with the oxide layer 202 and the amorphized layer 204 is flipped and bonded to the handle substrate 210.

Figure 4E:
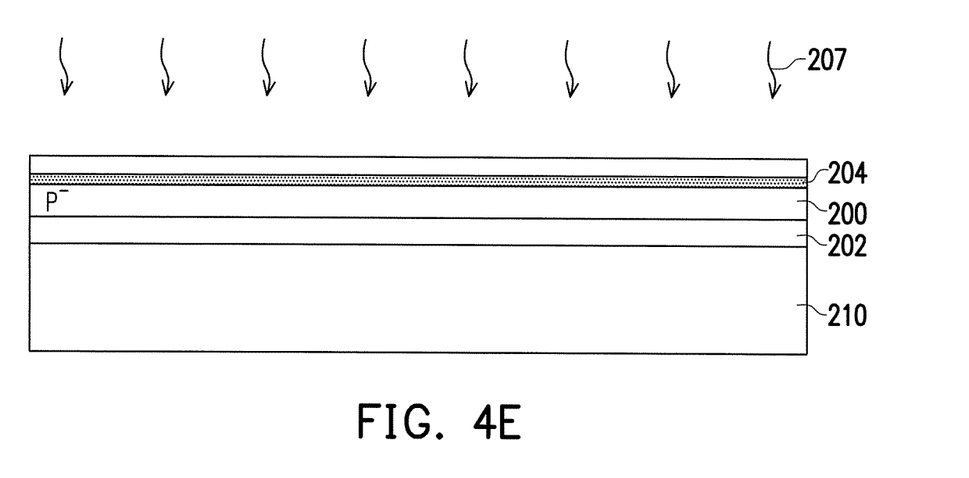

Referring to FIG. 3 and FIG. 4E, in operation 38, a first annealing process 207 is performed after bonding the device substrate 200 to the handle substrate 210.

The operation 38 is similar to the operation 16 described above. In some embodiments, the first annealing process 207 is referred to as a first post-bonding or post-mating annealing through the specification. In some embodiments, the first annealing process 207 is performed still at low enough temperature to preserve the amorphized layer 204, so it is in a range from about 100° C. to 400° C.

Figure 4F:
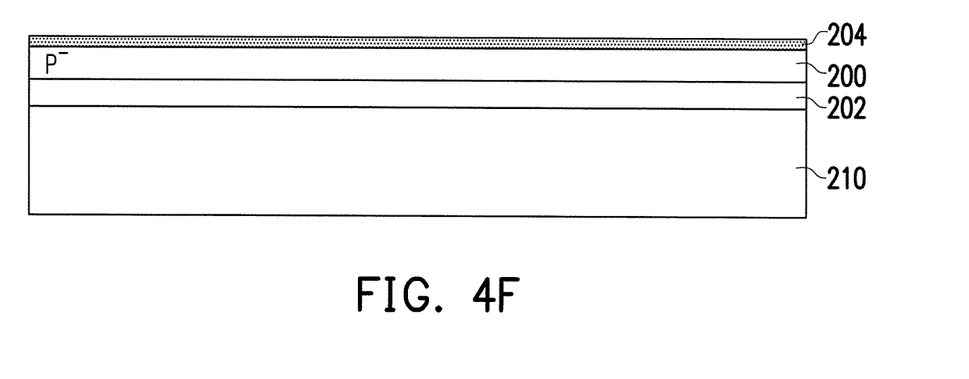

Referring to FIG. 3 and FIG. 4F, in operation 40, the device substrate 200 is partially removed until the amorphized layer 204 is exposed.

The operation 40 is similar to the operation 20 described above. In some embodiments, the P− device substrate 200 is subjected to a mechanical grinding operation, followed by a selective etch operation. In some embodiments, an alkaline bath such as TMAH is used. As compared to the previous embodiments, HNA etch is eliminated. This is another major cost saving.

Figure 4G:
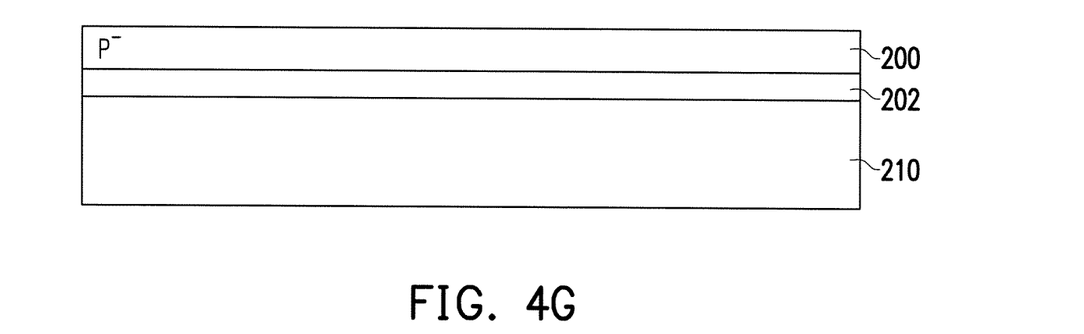

Referring to FIG. 3 and FIG. 4G, in operation 42, the amorphized layer 204 is recrystallized or removed.

The operation 42 is similar to the operation 22 described above. In some embodiments, the amorphized layer 204 is recrystallized and converted back into regular silicon with a recrystallization annealing. In alternative embodiments, the amorphized layer 204 is removed with an etching until the surface of the amorphized layer 204 is exposed.

Figure 4H:
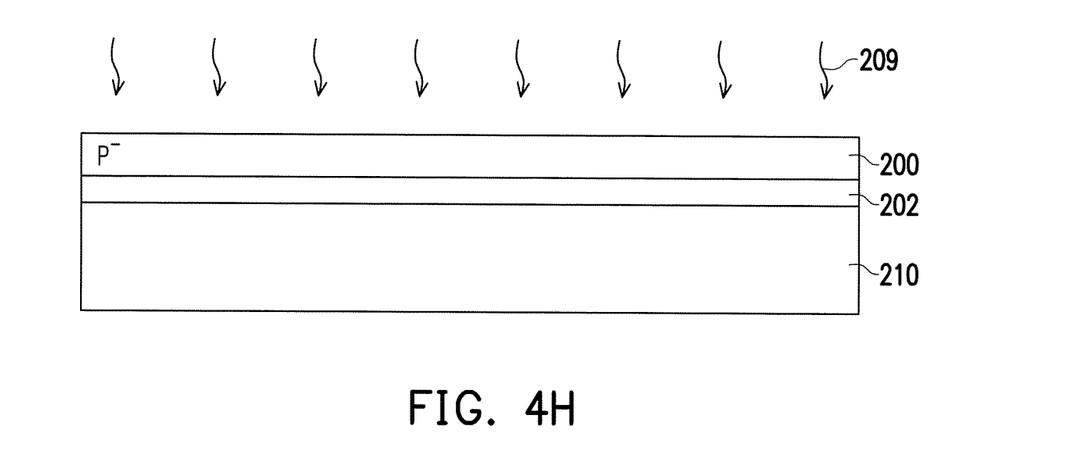

Referring to FIG. 3 and FIG. 4H, in operation 44, a second annealing 209 is performed after recrystallizing or removing the amorphized layer 204.

The operation 44 is similar to the operation 24 described above. In some embodiments, the second annealing 209 is referred to as a second post-bonding or post-mating annealing through the specification. In some embodiments, the second annealing 209 is performed at a temperature of about 1100-1200° C., so as to further improve quality of the bonding interface. In some embodiments, the temperature of the first annealing process 207 is less than the temperature of second annealing process 209.

Figure 4I:
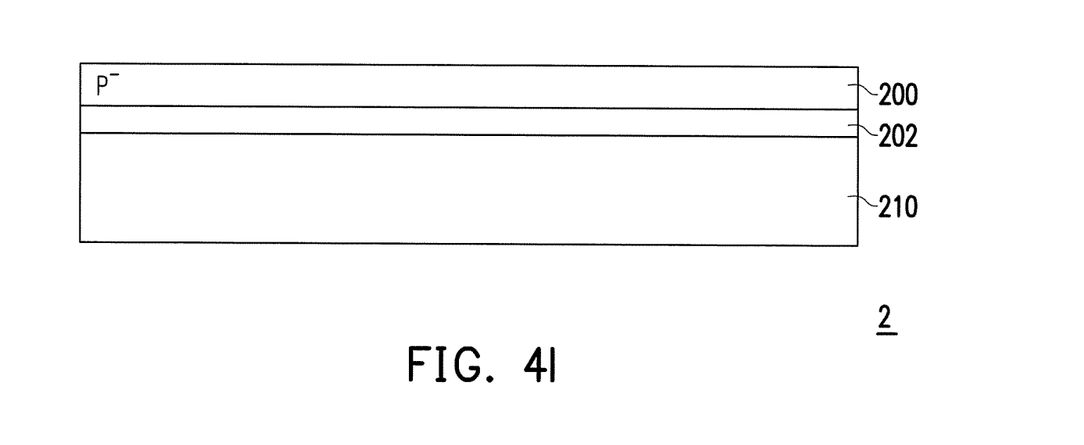

Referring to FIG. 3 and FIG. 4I, in operation 46, a top silicon smoothing process is optionally performed.

The operation 46 is similar to the operation 26 described above. In some embodiments, the surface of silicon film is smoothed to near atomic flatness, such as about 2 Å rms. This top silicon smoothing operation can be performed using processes described above, such as HCl annealing or oxidation/oxide strip cycle. A SOI substrate 2 of the disclosure is thus completed.

In some embodiments, with the SOI non-EPI process of the disclosure, the top silicon film has no defects that are characteristic to epitaxial film (epitaxial stacking faults, substrate-induced defects, epitaxial crown, faceting, pyramids, hillocks, haze, etc.) In some embodiments, oxygen concentration in the top silicon film comes from a denuded zone of a starting device substrate, and therefore, it has about an order of magnitude higher oxygen concentration (~E17 $cm^{-3}$) than that (~E16 $cm^{-3}$) in epitaxy layer. In some embodiments, the lattice constant in the top silicon film comes from initial lightly doped device substrate, so it has an undisturbed silicon lattice constant 5.43095 Å. While known SOI processes use heavily boron doped initial wafer with lattice parameter about 0.1% smaller, and that parameter is transferred to the top silicon film.

In some embodiments, the method of the disclosure provides low total thickness variation (TTV) within the wafer. In some embodiments, the SOI non-EPI process allows cost saving by removal of final thinning operation, a smoothing (e.g., hydrogen anneal) is optionally performed to finalize the wafer. Also, this way the wafer with extremely low top silicon TTV can be made—as the thickness is determined by ion energy only (i.e., very controllable and stable) and a reference plane is counted from oxide top.

In some embodiments, the method of the disclosure provides inherent process cleanness. For example, using silicon-into-silicon bring no new material to the wafer. One consequence is, the wafer can be processed in both BEOL as well as FEOL lines without bringing any risk cross contamination. Besides, ion implantation dose is much lower than (e.g., 2 order of magnitude lower than) that required for the prior art.

In some embodiments, the method of the disclosure provides crystalline quality. When the implantation energy is significantly higher than energy range at which ions produce atomic displacements, i.e. 1 to 20 keV, there is a surface layer above the damaged area which is nearly not affected. In some embodiments, the implantation energy ranges from about 60 to 600 keV. Such energies are chosen so the low damage thickness propagates from surface down to targeted final thinning point of the SOI.

In some embodiments, the wafer-to-wafer and within-the-wafer top silicon thickness uniformity (<1%) is much better as it is determined only by ion implantation energy, not by epitaxy process (~10%).

In view of the above, with the methods of the disclosure, a SOI substrate is formed with a high quality top Si-BOX interface, and lower quality bonded interface thereof is at the bottom of the BOX, or in the middle of the BOX. Therefore, high quality CMOS and other circuitry can be formed in the top silicon film of the SOI substrate.

In accordance with some embodiments of the present disclosure, a method of forming a SOI substrate includes the following operations. An epitaxial layer and an oxide layer are formed on a sacrificial substrate. An etch stop layer is formed in the epitaxial layer. The sacrificial substrate is bonded to a handle substrate at the oxide layer. The sacrificial substrate is removed. The epitaxial layer is partially removed until the etch stop layer is exposed.

In accordance with alternative embodiments of the present disclosure, a method of forming a SOI substrate includes the following operations. An oxide layer is formed on a device substrate. An amorphized layer is formed in the device substrate. The device substrate is bonded to a handle substrate at the oxide layer. The device substrate is partially removed until the amorphized layer is exposed. In some embodiments, the amorphized layer includes C, Si, Ge, Ne, Ar, Kr, Xe, F, Cl, Br, I, N, O or a combination thereof.

In accordance with yet alternative embodiments of the present disclosure, a method of forming a SOI substrate includes the following operations. An epitaxial layer is formed on a sacrificial silicon substrate. The epitaxial layer is oxidized to form an oxide layer on a top of the epitaxial layer. The epitaxial layer is partially amorphized. The sacrificial silicon substrate is bonded to a handle substrate at the oxide layer. The sacrificial silicon substrate is removed. The epitaxial layer is recrystallized.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a silicon-on-insulator (SOI) substrate, comprising:
   forming an epitaxial layer on a sacrificial substrate;
   forming an oxide layer on the epitaxial layer;
   forming an etch stop layer in the epitaxial layer by performing an ion implantation process, wherein an element for the ion implantation process comprises silicon;
   bonding the sacrificial substrate, at the oxide layer, to a handle substrate;
   removing the sacrificial substrate; and
   partially removing the epitaxial layer until the etch stop layer is exposed,
   wherein the oxide layer has a top surface close to the remaining epitaxial layer and a bottom surface away from the remaining epitaxial layer, and a bonding interface is at the bottom surface of the oxide layer.

2. The method of claim 1, wherein the ion implantation process comprises amorphizing a middle portion of the epitaxial layer to form the etch stop layer.

3. The method of claim 1, further comprising recrystallizing the etch stop layer by performing a solid phase epitaxy after partially removing the epitaxial layer.

4. The method of claim 1, further comprising removing the etch stop layer after partially removing the epitaxial layer.

5. The method of claim 1, wherein the oxide layer is formed by oxidizing a top portion of the epitaxial layer.

6. The method of claim 1, wherein the oxide layer is formed by depositing an oxide material on the epitaxial layer.

7. The method of claim 1, wherein the sacrificial substrate and the epitaxial layer are of the same conductivity type, and the sacrificial substrate has a doping concentration greater than that of the epitaxial layer.

8. The method of claim 1, further comprising:
   performing a first annealing process after bonding the sacrificial substrate to the handle substrate and before removing the sacrificial substrate; and
   performing a second annealing process after partially removing the epitaxial layer,
   wherein a temperature of the first annealing process is less than a temperature of second annealing process.

9. A method of forming a silicon-on-insulator (SOI) substrate, comprising:
   forming an oxide layer on a device substrate;
   performing an ion implantation process to form an amorphized layer in the device substrate;
   bonding the device substrate, at the oxide layer, to a handle substrate; and
   partially removing the device substrate,
   wherein an element for the ion implantation process comprises Si,
   wherein the method further comprises performing a first annealing process after bonding the device substrate to the handle substrate and before partially removing the device substrate, and the first annealing process is in a range from about 100° C. to 400° C.

10. The method of claim 9, wherein forming the amorphized layer comprises performing an ion implantation process.

11. The method of claim 9, further comprising recrystallizing the amorphized layer after partially removing the device substrate.

12. The method of claim 9, further comprising removing the amorphized layer after partially removing the device substrate.

13. The method of claim 9, wherein the oxide layer is formed by oxidizing a top portion of the epitaxial layer.

14. The method of claim 9, wherein the oxide layer is formed by depositing an oxide material on the epitaxial layer.

15. A method of forming a silicon-on-insulator (SOI) substrate, comprising:
   forming an epitaxial layer on a sacrificial silicon substrate;
   oxidizing the epitaxial layer to form an oxide layer on a top of the epitaxial layer;
   partially amorphizing the epitaxial layer to form an etch stop layer by performing an ion implantation process, wherein an element for the ion implantation process comprises silicon;
   bonding the sacrificial silicon substrate, at the oxide layer, to a handle substrate;

removing the sacrificial silicon substrate; and recrystallizing the epitaxial layer to remove the etch stop layer by performing a solid phase epitaxy.

16. The method of claim 15, further comprising, after removing the sacrificial silicon substrate and before recrystallizing the epitaxial layer, partially removing the epitaxial layer.

17. The method of claim 15, further comprising:

performing a first annealing process after bonding the sacrificial silicon substrate to the handle substrate and before removing the sacrificial silicon substrate; and performing a second annealing process after recrystallizing the epitaxial layer, wherein a temperature of the first annealing process is less than a temperature of second annealing process.

* * * * *